United States Patent
Hutchison et al.

[19]

[11] Patent Number: 6,061,251
[45] Date of Patent: May 9, 2000

[54] LEAD-FRAME BASED VERTICAL INTERCONNECT PACKAGE

[75] Inventors: Brian R. Hutchison, Windsor; Peter Walters, Santa Rosa, both of Calif.

[73] Assignee: Hewlett-Packard Company, Palo Alto, Calif.

[21] Appl. No.: 08/925,423

[22] Filed: Sep. 8, 1997

[51] Int. Cl.$^7$ ...................................................... H05K 7/02
[52] U.S. Cl. ........................... 361/820; 361/816; 361/818; 361/803; 361/764; 361/767; 361/772; 257/734; 257/736; 257/750; 257/782; 257/784; 174/52.1; 174/255
[58] Field of Search ..................................... 361/820, 816, 361/818, 800, 803, 792, 761, 762, 764, 767, 772; 174/35 R, 52.1, 250, 255; 257/734, 735, 736, 750, 774, 782, 784

[56] References Cited

U.S. PATENT DOCUMENTS

| | | | |
|---|---|---|---|
| 4,868,712 | 9/1989 | Woodman | 361/689 |
| 5,111,199 | 5/1992 | Tomoda et al. | 340/825.72 |
| 5,117,068 | 5/1992 | Seieroe et al. | 174/52.4 |
| 5,353,194 | 10/1994 | Libretti et al. | 361/707 |
| 5,355,016 | 10/1994 | Swirbel et al. | 257/659 |
| 5,438,305 | 8/1995 | Hikita et al. | 333/32 |
| 5,448,826 | 9/1995 | Goetz et al. | 29/848 |
| 5,451,818 | 9/1995 | Chan et al. | 257/728 |
| 5,574,314 | 11/1996 | Okada et al. | 257/728 |
| 5,574,630 | 11/1996 | Kresge et al. | 361/792 |
| 5,764,119 | 6/1998 | Miyagi et al. | 333/238 |
| 5,780,776 | 7/1998 | Noda | 174/255 |
| 5,786,986 | 7/1998 | Bregman et al. | 361/719 |

FOREIGN PATENT DOCUMENTS 0 725 441 A2   8/1996   European Pat. Off. ........ H01L 23/66

*Primary Examiner*—Leo P. Picard
*Assistant Examiner*—David Foster

[57] ABSTRACT

A vertical interconnect package for electronic components and a method to manufacture same.

The invention provides a tripartite lead frame-based Vertical Interconnect Package (VIP) which provides integrated feedthrough and integrated shielding in a non-ceramic package. One frame functions as the substrate for coupling the IC device, the second lead frame and third lead frames form shielding and feedthroughs, with the third also providing a lid whereby an airtight chamber around the IC is formed. The invention provides a ground button (the shortest path to the die) divided into n sections providing additional RF and separate ground paths; lead frame connections are used for DC. A method for assembling includes batch lead frame assembly and test prior to singulation.

The VIP provides improved performance at lower manufacturing cost and provides easy interfaces to the printed circuit board in surface mount technology manufacturing and is compatible with die mount technologies such as flip-chip.

13 Claims, 10 Drawing Sheets

LEAD-FRAME BASED VERTICAL INTERCONNECT PACKAGE

FIELD OF USE

The invention herein relates to electrical interconnect devices, in particular to interconnects useful in packaging integrated circuits and most particularly those operating at frequencies above 2 GHz.

BACKGROUND

Wireless devices for consumer use and the constant trend towards miniaturization demand improvements in microelectronic device packaging and electrical interconnection. For low cost, high volume applications, conventional plastic package technologies are relatively inexpensive and, therefore, attractive. However limitations of bandwidth and isolation render plastic packages generally unsuitable for high frequency applications. The typical maximum usable frequency for a conventional plastic package is about 2 GHz. Package modifications can extend operational frequency, but not much above 4 GHz. Because the signal transmission is horizontal rather than vertical, the frame in a typical plastic package interferes with performance. The package frame contributes significant inductance; as the operational frequency increases, impedance increases. Some plastic packaging provides for a cavity around the IC device, thereby improving performance (See Dozier U.S. Pat. No. 5,428, 188). However, performance improvement is constantly sought especially at higher RF and microwave frequencies.

Ceramic based packages are less subject to frame impedance but are typically quite limited in their ability to provide suitable isolation for high frequency applications. Moreover, a ceramic package typically costs around $10 and is, therefore, too expensive for most low cost products. Other packaging technologies all present either cost or performance problems especially with respect to applications designed to operate at high frequencies. Ball Grid Array (BGA) package performance, for example, is subject to serious limitations: difficulty in minimizing the ground and lead inductance; restrictions in design of impedances arising out of manufacturing limitations. Moreover, ground isolation is hampered by the added inductance of the balls in the grid array.

Thus, currently available packaging technologies are not wholly satisfactory for demanding RF, microwave, and millimeter wave applications that require good high frequency performance and low manufacturing cost.

SUMMARY OF THE INVENTION

The invention provides a vertical interconnect package for electronic components especially suitable for high frequency operation and a method to manufacture same. The invention provides a lead frame-based Vertical Interconnect Package (VIP) featuring integrated feedthrough and integrated shielding. The package can be composed of two, three or more lead frame layers. A first lead frame functions as the substrate for coupling the IC or other attachable device. A second lead frame and third lead frames form shielding and feedthroughs by alignably coupling with the first lead frame and the device attached thereto. A third lead frame may also provide a lid whereby a lidded chamber around the attached device is formed. Multi chamber packages are possible, wherein more than one device is attached to the substrate layer and electrically connected. In embodiments including more than three lead frames, there may be more than one substrate layer, and more than one chamber per substrate layer.

The invention provides a ground pad (providing thereby the shortest path to the die) divided into n sections providing additional RF and separate ground paths. By designing variations in the thickness of portions of the lead frame, the lead frame VIP package accomodates characteristic impedance or matching structure. Also, shielding is accomplished by design of lead frame structures and may provide multiple cavities per package in which devices may be attached. Such multimodule packages demonstrate superior performance at high frequencies.

A method is provided for assembling the invention and the method includes batch lead frame assembly and package test prior to singulation.

The multi layer leadframe-based VIP provides improved performance at economical manufacturing cost, simplified interface to the printed circuit board in surface mount technology manufacturing, and compatibility with die mount technologies. The invention provides superior isolation, controlled impedance at the RF ports and superior feedthrough structure for DC connection.

DETAILED DESCRIPTION OF THE PREFERRED EMBODIMENT

Figure 4:
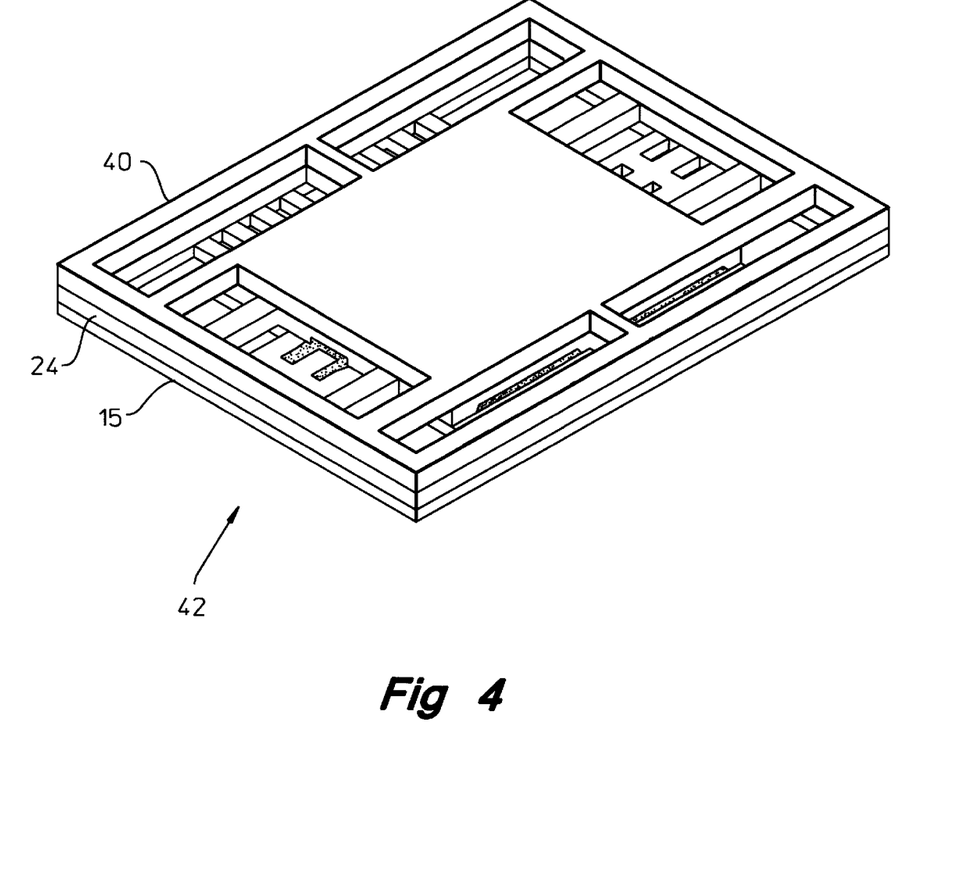
FIG. 4 depicts the third lead frame attached to the first and second lead frames and the couled IC device in a chamber beneath the third lead frame.

The assembled inventive package is depicted in FIG. 4. This description will commence with the first lead frame layer (FIG. 1A) and additively progress through the preferred embodiment of the inventive package. It is to be understood that, notwithstanding the representation of an IC device as the device to be electrically interconnected, other devices may be interconnected electrically according to the invention provided herein.

Figure 1A:
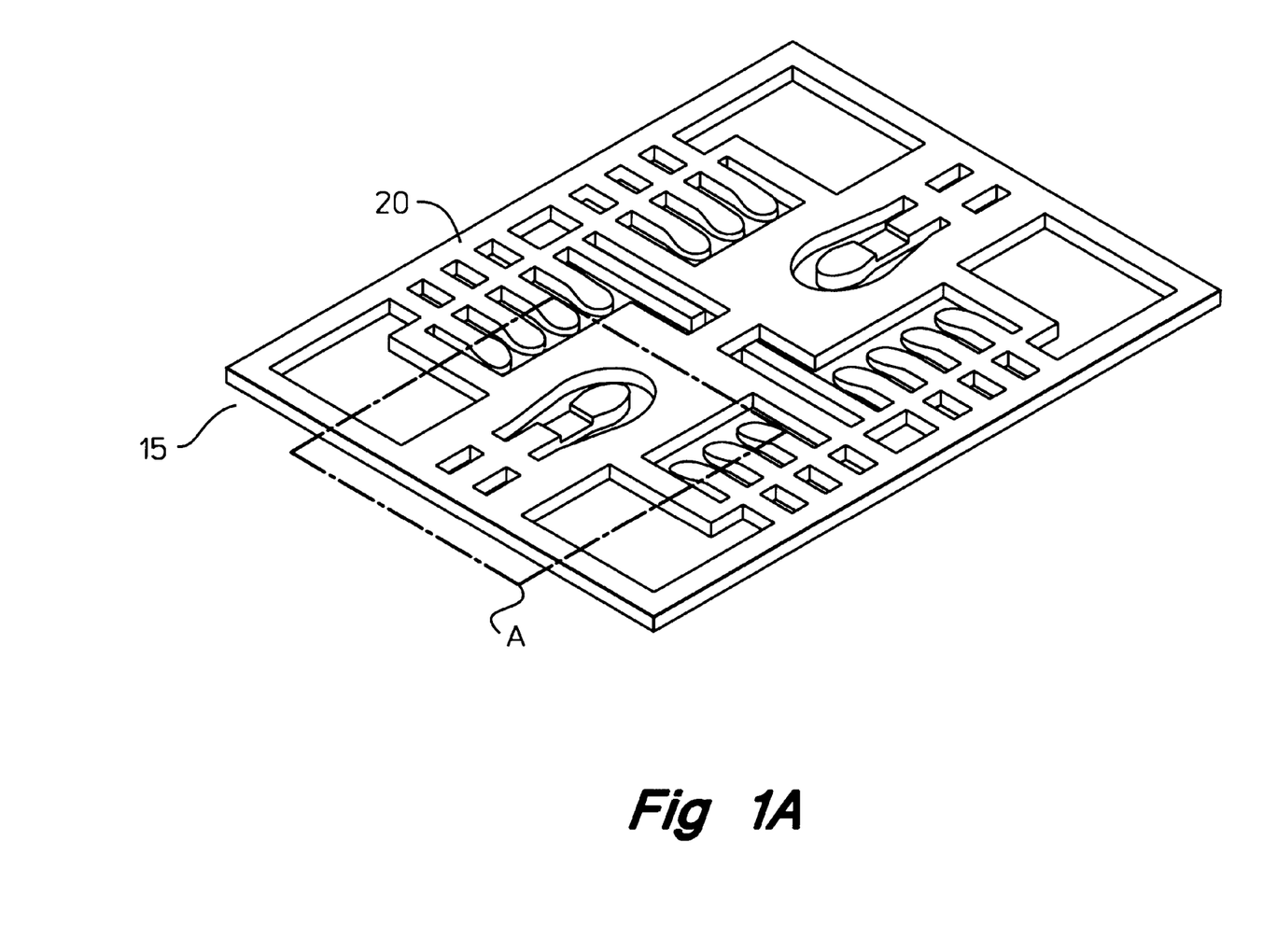
FIGS. 1A and B inclusive, depicts the first lead frame, with 1B representing an enlargement of the area demarcated in 1A.
Figure 1B:
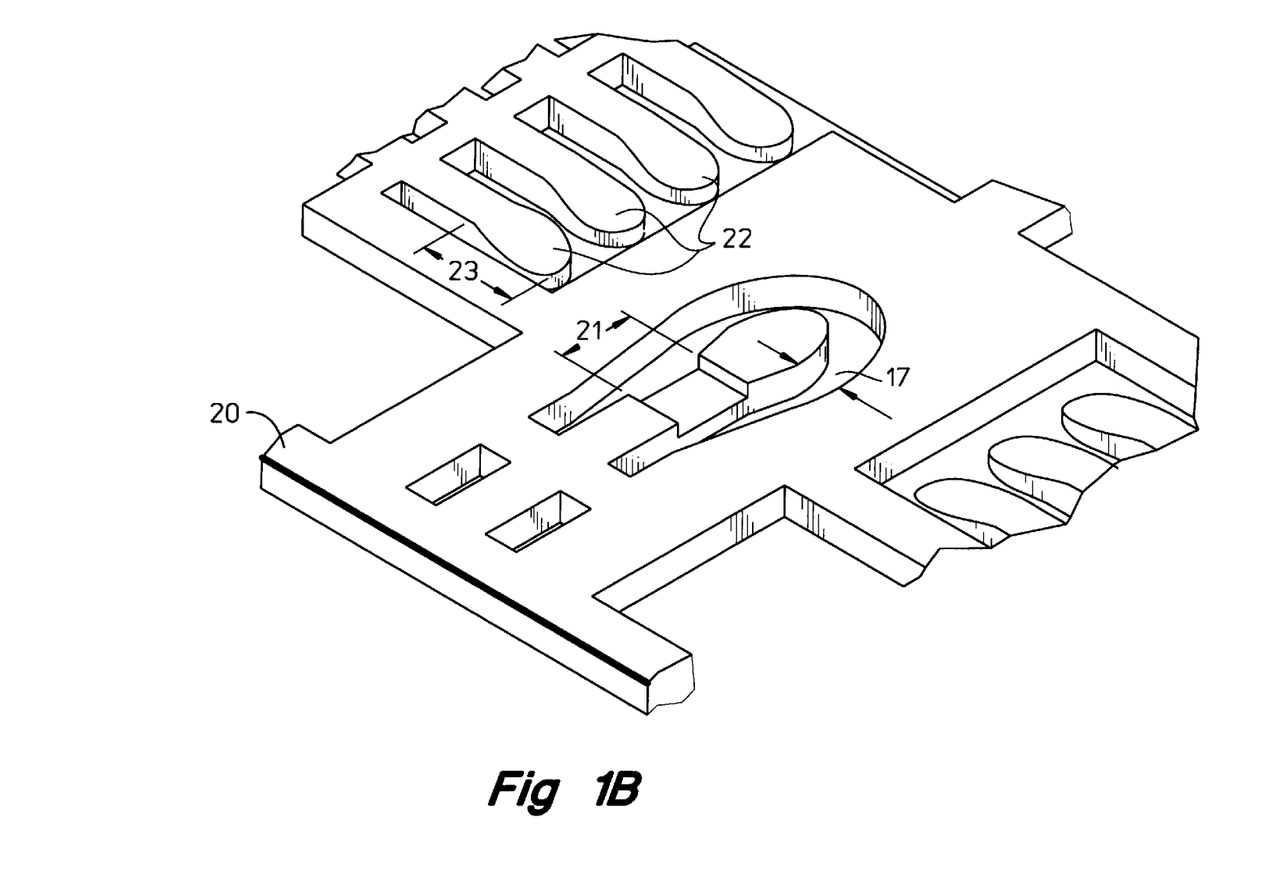

FIG. 1A illustrates the first lead frame 15 of the preferred tripartite lead frame package structure. The first lead frame 15 is configured to provide leads to whatever selected electronic device is to be packaged. The leads 22 as shown enlarged in FIG. 1B are shaped with predetermined flares or "lock-in assists" 23 to securely position the leads in the plastic encapsulation medium after the package is trimmed. Such lock-in assists 23 are not essential to the invention, but in practice are highly desirable for reasons that do not require exposition.

FIG. 1B also illustrates the varying thickness of various portions of the lead frame. In particular, the RF end Notch 21, the RF Gap Width 17, and the RF Lead Width 19. The design incorporates these spacing relations and thickness variations to impart a characteristic impedance to the package formed of which this substrate layer forms a part.

Figure 2A:
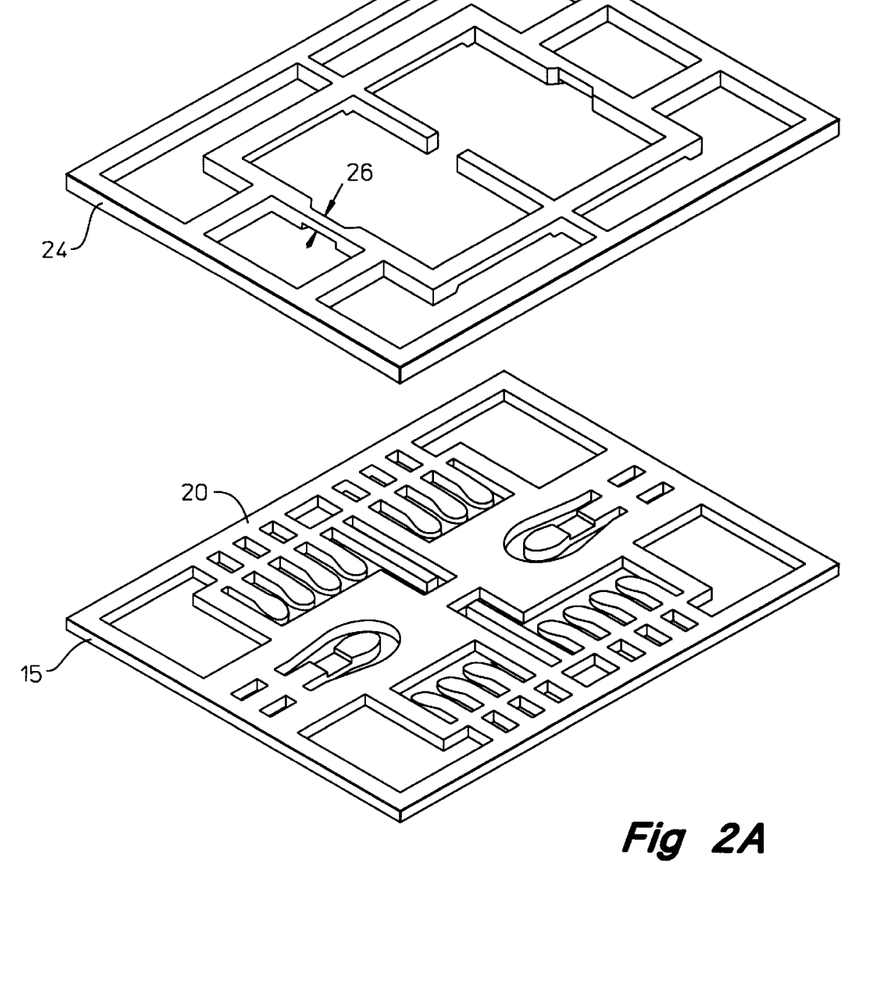
FIGS. 2A through C inclusive, illustrates the first lead frame and the second lead frame A before coupling and B after coupling, and C after encapsulation with plastic.

FIG. 2A shows the first lead frame 15 and above the upper surface 20 of the first lead frame 15 the second lead frame 24. The design geometries of the second lead frame include a narrowed wall neck NWN 26. The NWN 26 is reduced in width in one or more dimension, and such width reduction provides reduces capacitance.

Figure 2B:
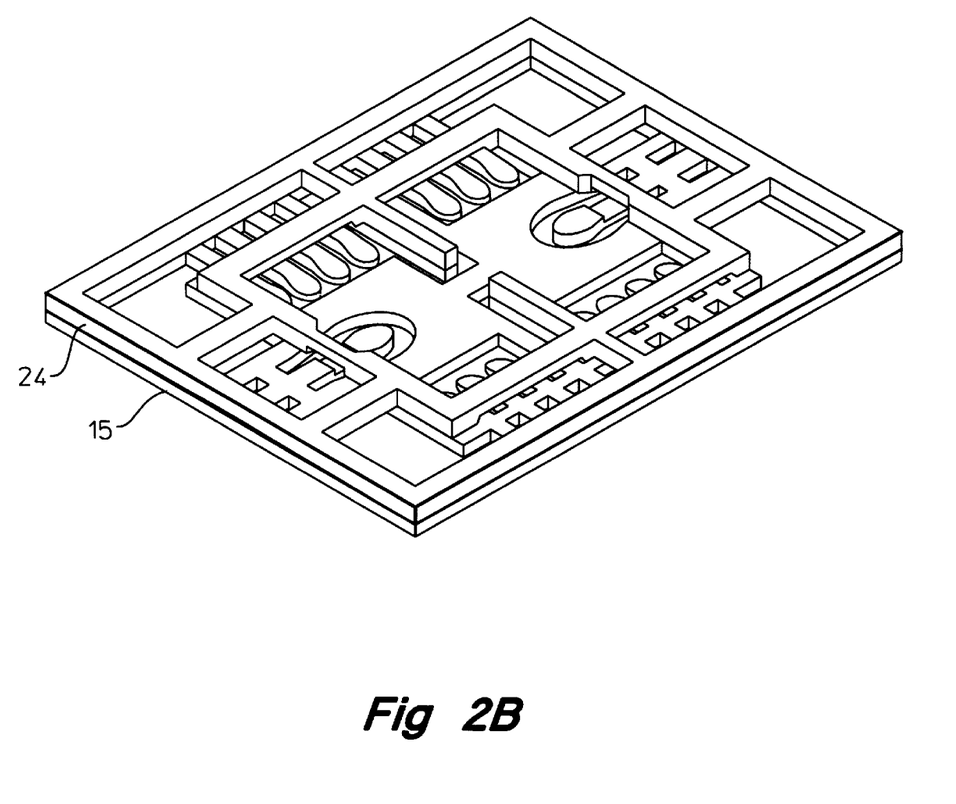
Figure 2C:
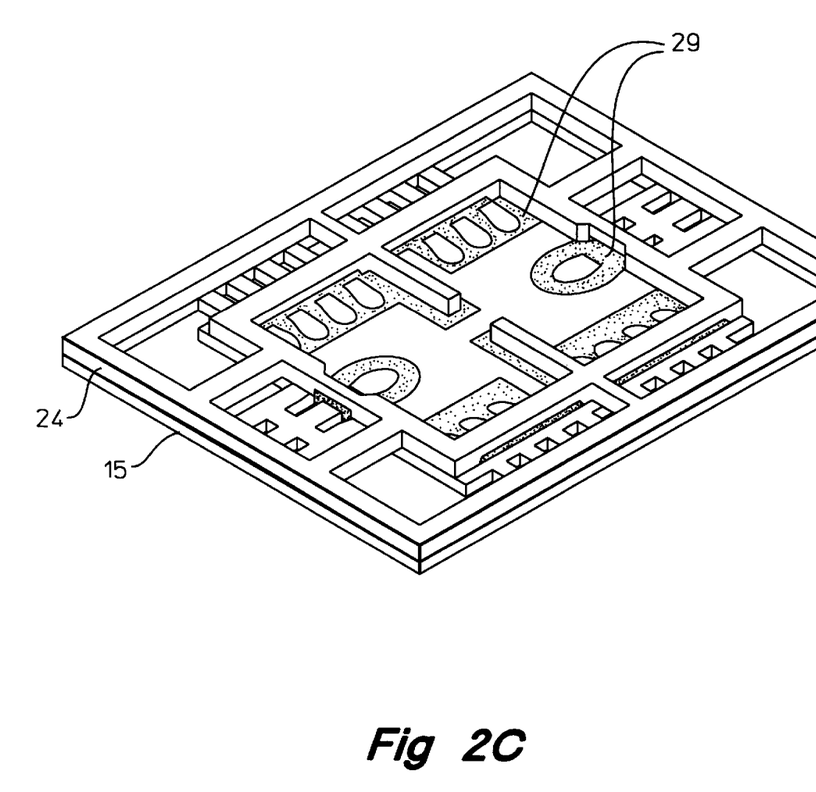

The first and second lead frames 15, 24 are shown coupled in FIG. 2B and plastic encapsulation of the leads 29 (typically by means of injection molding so as to contain and control the encapsulation material) is depicted in FIG. 2C.

Figure 3:
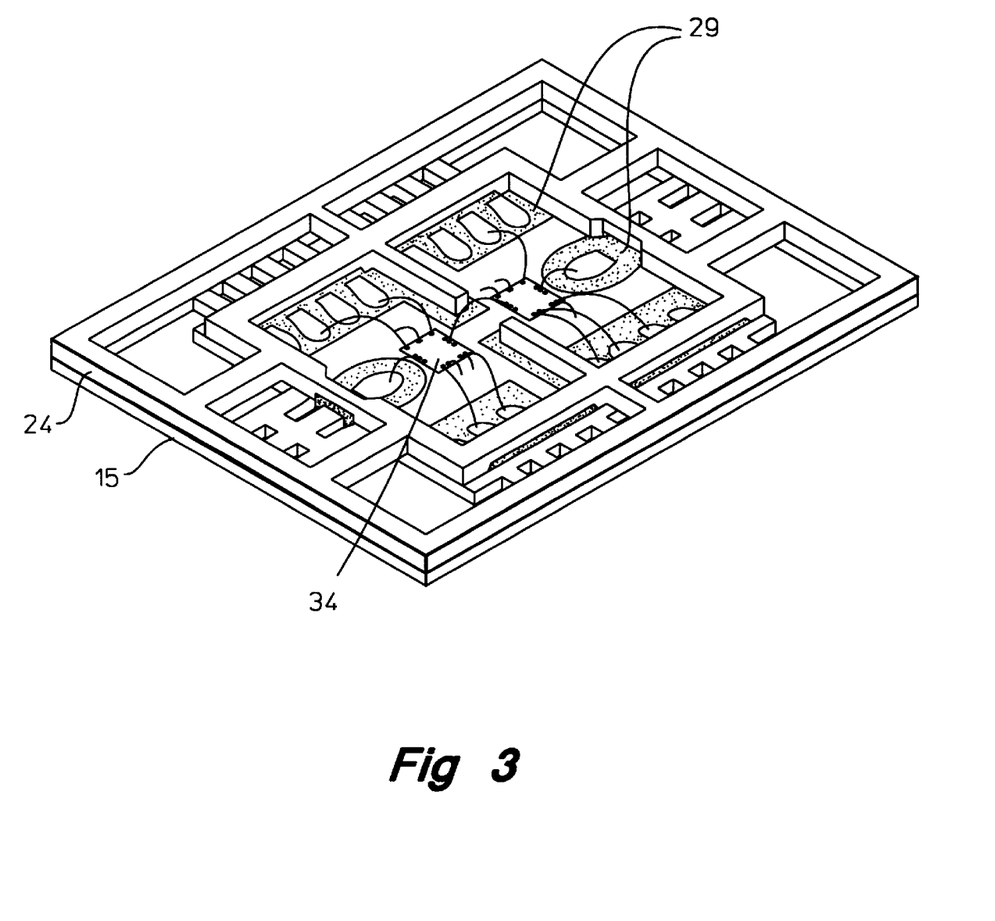
FIG. 3 depicts an IC device coupled to the substrate first lead frame and second lead frame.

FIG. 3 depicts an IC or other device to be coupled device 34 coupled to the first lead frame 15 in combination with the second lead frame 24, collectively shown as assemblage 30. As can be noted by the connections of the device to the pad area of the first lead frame substrate layer, the functional features include: an RF pad 36, a ground plane 31, a DC pad 32. Bond wires 33 are depicted in this embodiment, electrically connecting the device to the package. It is easily understood that a substantially lateral or minimal arc in the bond wire path may be achieved by thinning the floor of the first lead frame in the area upon which a device will be attached and placing the IC 34 or other device to be mounted into the shallow depression created by the thinning. Reducing the wire length reduces thermal resistance and ground, as does shortening and flattening of the wire path FIG. 4 depicts the third lead frame 40 acting as a lid, attached to the upper surface of the second lead frame 24, which in turn is coupled to the first lead frame 15 and to which is attached the IC or other device 34 (not in view) in a chamber beneath the third lead frame 40.

The third lead frame 40 is metal-plated, and can easily be soldered or otherwise attached or coupled with the second lead frame 24, forming an assembled tripartite lead frame based vertical interconnect package 42 providing lidded chamber beneath. The underside of the third lead frame (not shown) may be thinned, as thinning the lead frame in the portion corresponding to the device attach area provides additional clearance to ensure that bond wires do not contact the lid.

In general, the lead frame design for the application of n vertical interconnect assemblies is accomplished by the principles and methods widely know in the art of lead frame design. As discussed in connection with FIG. 1B above, the RF pads are shaped and spaced to provide a controlled impedance into the package. As with lead frame design in general, features including pads and ground plane are connected to the leadframe by a web prior to trimming.

The preferred embodiment employs lead frame base material of 0.010" thick copper. Copper is an excellent thermal conductor and the VIP package provides a direct path for heat flow away from the device. However, other conductive materials and alloys may be suitable and selected by a materials specialist.

The lead frames in the preferred embodiment are plated with a nickel/palladium/gold finish. This lead finish that is both wire bondable and saturable. The gold flash is a mere 3 micro inches thick. The substrate leadframe is plated prior to device or die attach so that the interior and exterior of the package have the same finish. Coupling of the leadframes may be accomplished by braising, soldering, or any other suitable method.

The inventive lead frame package provides one or more chambers within which the device or devices may be housed (see FIG. 2C and FIG. 3). The degradation and losses of a high frequency device encapsulated in plastic can be eliminated by replacing plastic encapsulation with the airfilled chamber. It is well known that elimination of plastic encapsulation especially in high frequency devices improves isolation in Field Effect Transistors (FETS) and other devices. Fine leads can easily be damaged during trimming of lead frames unless package design include securing the leads. The invention provides injected molding material to secure lead thereby enhancing lead stabilization. Molding materials such as polyphenylene sulfide and liquid crystal polymers are injectable into tight spaces and capable of good wall strength and produce less flash, better surface adhesion than other molding materials.

Trimming the package from the leadframe is performed after lid attach. Testing of the package can be done before singulation, that is to say, before the strip of multiple lead frame packages is cut into individual package units. Batch testing prior to singulation may eliminate one of the chronic bottlenecks of package production lines and create significant manufacturing efficiencies.

The VIP package taught herein is compatible with standard die attach and bonding methods. The leadframe and device could also be designed to utilize flip chip and other emerging chip interconnect schemes. For devices whose performance does not require an open chamber, the device could be fully encapsulated after die attach and bonding to a bare leadframe.

Figure 5:
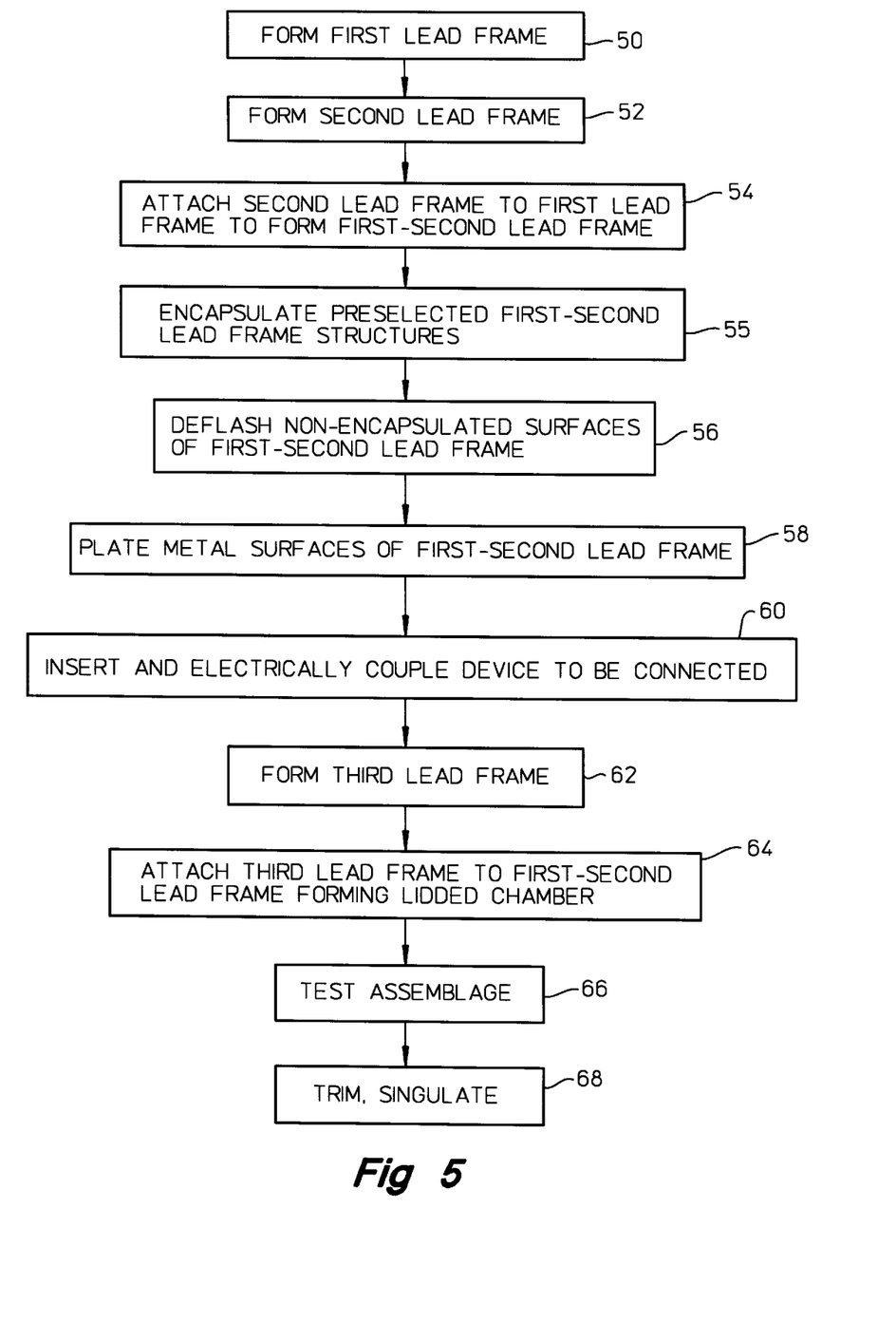
FIG. 5 outlines the inventive method.
Figure 6:
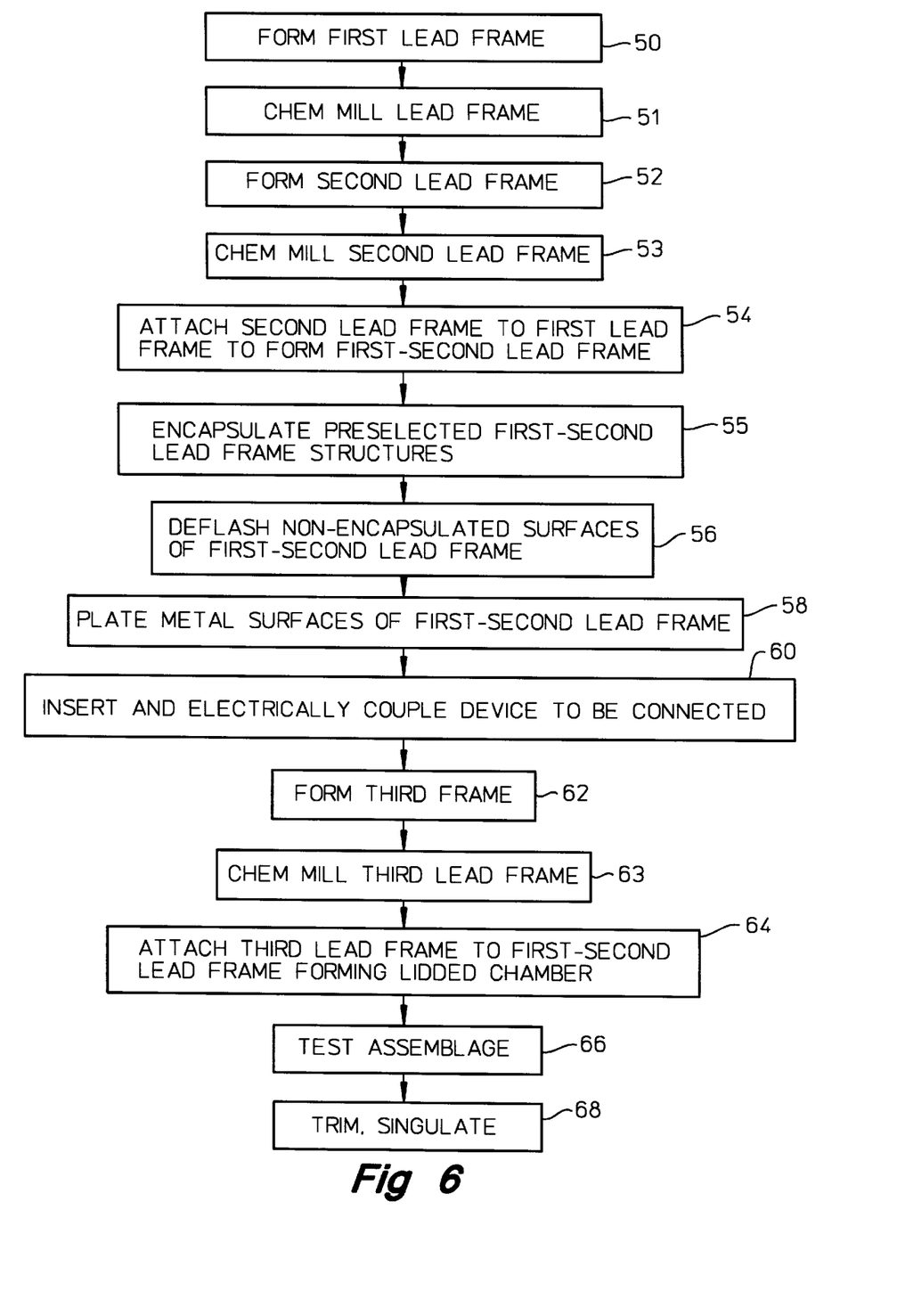
FIG. 6 outlines the preferred embodiment of the inventive method.

FIG. 5A depicts the method taught herein, and FIG. 6 depicts the method of the preferred embodiment. The method FIG. 5 includes the steps of first lead frame formation 50 wherein the first lead frame has an upper and a lower surface. In some embodiments and in the preferred embodiment, chem milling 51 the first lead frame is performed for reasons discussed relative to FIG. 1 above and depicted in FIG. 6. A second lead frame is formed 52, also with an upper and lower side, and the lower side of the second lead frame is attached 54 to the upper side of the first lead frame, forming thereby a first-second lead frame assembly. The first-second lead frame assembly is subjected to any of a number of known processes whereby select portions of the assembly are encapsulated in plastic 55 or other moldable compounds. The partially encapsulated assembly is then deflashed 56 and the remaining exposed metal surfaces plated 58.

The device to be packaged is inserted into the assembly such that it is in contact with a ground plane, and such connections as are necessary are made 60. Connections may be by wirebonding, or whatever other connection techniques which may be suitable.

A third lead frame is formed and metal plated 62 and placed in contact with the upper surface of the second lead frame 64. Such contact of the third and second lead frames encloses the space beneath thereby forming a lidded chamber around the attached device, without contacting the device.

In some embodiments, more than one device is inserted and electrically coupled to form a multimodule package.

Testing 66 of the package may be done while the lead frames remain in strips prior to singulation. After testing 66, the packages may be trimmed, singulated 68 and, typically, binned.

FIG. 6 illustrates the additional steps of chem milling 51, 52, 63 any or all of the lead frame layers to accommodate design requirements, especially for performance at higher frequencies.

Figure 7:
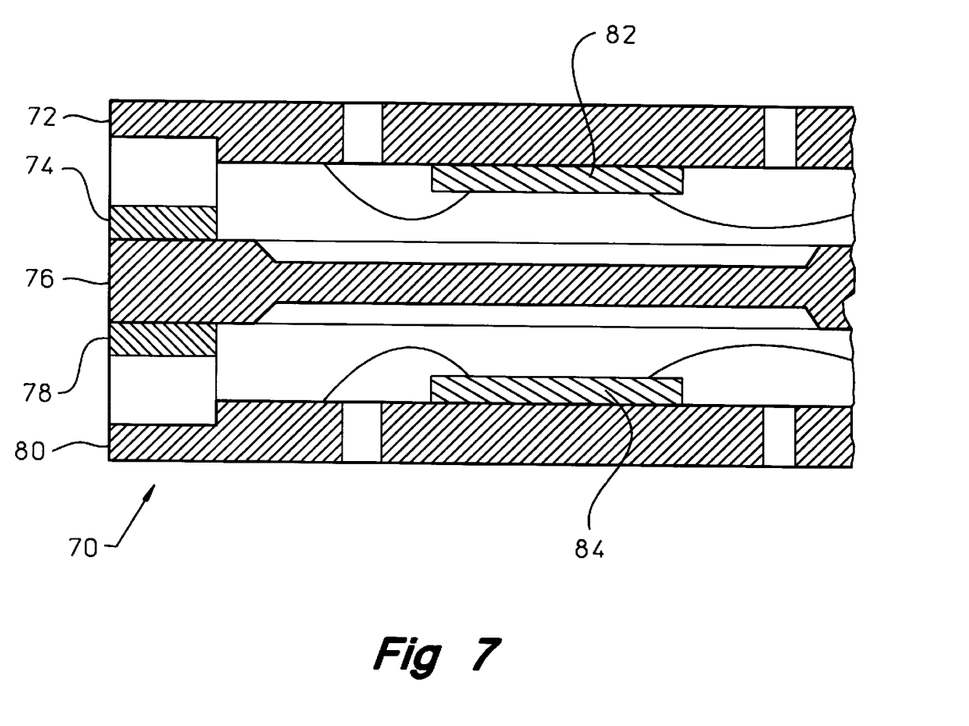
FIG. 7 depicts a partial cross section an alternate embodiment of the invention.

The invention further provides for multiple layering to be used in the vertical interconnect package. By way of example, FIG. 7 shows five lead frame layers in an assembly 70. The package depicted is a portion of a multi module unit wherein two of the five lead frame layers act as IC device supporting layers. A first and second lead frame layer 72, 80 each have attached IC devices 82, 84 respectively. Both first and second lead frame have an intermediate lead frame associated with and attached to the IC supporting leadframe 72, 80. FIG. 7 illustrates only a portion of the cross section of the intermediate layers 74, 78. One middlemost lead frame layer 76 provides the lid to each of the IC supporting lead frames, the IC connected thereto and the associated intermediate lead frame (72, 82 and 74 in one instance and 80, 84 and 78 in the other). As FIG. 7 depicts only a portion of the multimodule package, there remains undepicted the possible plurality of IC connections per each IC supporting lead frame substrate.

Such multi-layer embodiments provide multi module capacity and enable multiple substrate layers.

The foregoing description of a preferred embodiment of the invention is presented for illustrative and descriptive purposes. It is not intended to be exhaustive or to limit the invention to the precise form disclosed. Obvious modifications or variations are possible in light of the above teaching. The chosen embodiment best illustrates the principles of the invention and it practical application to thereby enable one of ordinary skill in the art to best utilize the invention in various embodiments and with various modifications as may be suitable for the contemplated use. The scope of the invention is intended to be defined by the claims appended hereto.

We claim:

1. A package for a semiconductor device comprising:

a first conductive lead frame having a top and bottom side and at least a first and second lead, a second conductive lead frame having a top and bottom, connected on the bottom to said first lead frame and forming a raised structure upon the first lead frame;

a semiconductor device being mounted on the top surface of the first conductive lead frame and being coupled to the first and second leads;

a third lead frame attached to the top of the second lead frame and not contacting the semiconductor device and providing a lidded chamber therefor.

2. A package for a semiconductor device comprising:

a first conductive lead frame having a top and bottom side and at least a first and second lead, a second conductive lead frame having a top and bottom, connected on the bottom to said first lead frame and forming a raised structure upon the first lead frame; and said first and second lead frames being encapsulated in plastic, said encapsulation exclusive of the bonding and soldering surfaces said bonding and soldering surfaces being plated;

a semiconductor device being mounted on the top surface of the first conductive lead frame and being coupled to the first and second leads;

a third lead frame formed so as to create a lidded chamber in which the semiconductor device is mounted, said third lead frame attached to the top of the second lead frame and said lid not contacting the semiconductor device.

3. The semiconductor package as in claim 2 wherein the first lead frame includes at least one ground pad, at least one RF and DC ports.

4. An electrically conductive semiconductor device interconnect providing integrated feedthrough and integrated shielding comprising a first, second and third lead frame each having an upper and a lower surface;

the first frame having two or more ground pads, and at least one RF port;

the second lead frame being attached to the upper side first and plastic encapsulating the frame elements of the first lead frame excepting the upper surface to which the semiconductor device is attached, coupled to the grounds, and the lower surface;

said second lead frame attached to said first lead frame and providing a raised structure around said semiconductor device;

said third lead frame attached to said second lead frame, not contacting the semiconductor device, and forming a lidded chambers said lidded chamber containing said semiconductor device.

5. A package as in claim 1 wherein the electronic device operates at a frequency at or above 50 GHz.

6. An interconnect as in claim 1 wherein the bond wires to the semiconductor device have a reduced arc, thereby providing connections with reduced loss, thermal resistance and ground.

7. A package for an electronic device comprising:

a first conductive substrate;

nonconductive packaging material surrounding a predetermined portion of the conductive substrate, the electronic device coupled to the conductive substrate in an area devoid of packaging material;

an intermediate conductive substrate coupled to the first conductive substrate and which provides a raised structure around the electronic device;

a third conductive substrate attached to the intermediate substrate forming a sealed lidded chamber around the electronic device and not in physical contact with the electronic device.

8. A package as in claim 7 wherein n (n is greater than 2) conductive substrates are coupled and wherein a plurality of electronic devices are attached to one or more of n conductive substrates.

9. A method for fabricating a high performance integrated circuit package with increased package level shielding and increased isolation performance, the method comprising the steps of: forming a conductive lead frame having an upper and lower surface and at least a first and second lead;

forming a second lead frame having an upper and a lower surface;

attaching said second lead frame to the upper surface of the first lead frame, the second lead frame forming a raised structure around the first lead frame and leaving the lower surface of the first lead frame exposed;

encapsulating the first and second lead frames in plastic, excepting the surfaces intended for soldering or plating;

deflashing the unencapsulated surfaces;

plating all exposed metal surfaces;

attaching semiconductor device to upper exposed surface of first lead frame;

forming a third lead frame and plating said third lead frame;

attaching said third lead frame to the upper surface of the second lead frame, said third lead frame not contacting the semiconductor device and forming a lidded chamber having a sealed air pocket over said semiconductor device.

10. A method for fabricating a package for an electronic device, wherein said package provides integrated feedthroughs and shielding by means of first, second, and third leadframe structures, said method comprising the steps of:

attaching to the first lead frame the electronic device;

attaching the second lead frame to the first lead frame, forming necessary couplings for all feedthrough connections;

attaching the third lead frame to the second lead frame to form a lidded chamber, thereby sealing the package.

11. A method as in claim 10 further comprising the steps of attaching more than one IC per package and testing the batch lead frame prior to singulation.

12. A method as in claim 10 further including the step of encapsulating predetermined portions of the first lead frame in plastic prior to attaching the second lead frame.

13. A method as in claim 10 further including the steps of selectively modifying the thickness of various portions of the first, second and third lead frame.

\* \* \* \* \*